US012684953B2

(12) United States Patent
Cui et al.

(10) Patent No.: US 12,684,953 B2
(45) Date of Patent: Jul. 14, 2026

(54) DISPLAY PANEL AND MANUFACTURING METHOD THEREFOR, AND DISPLAY APPARATUS

(71) Applicant: BOE Technology Group Co., Ltd., Beijing (CN)

(72) Inventors: Ying Cui, Beijing (CN); Cheng Xu, Beijing (CN); Dandan Zhou, Beijing (CN); Linlin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 519 days.

(21) Appl. No.: 18/026,512

(22) PCT Filed: Jun. 17, 2022

(86) PCT No.: PCT/CN2022/099582
§ 371 (c)(1),
(2) Date: Mar. 15, 2023

(87) PCT Pub. No.: WO2023/240634
PCT Pub. Date: Dec. 21, 2023

(65) Prior Publication Data
US 2024/0298474 A1 Sep. 5, 2024

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/131* (2023.02); *H10K 59/873* (2023.02)

(58) Field of Classification Search
CPC .. H10K 77/00; H10K 59/1201; H10K 59/122; H10K 59/10; H10K 59/131;
(Continued)

(56) References Cited

U.S. PATENT DOCUMENTS

2021/0132720 A1* 5/2021 Lee ........................ G06F 3/0412
2021/0288284 A1* 9/2021 Huang ............. H10K 59/80521
(Continued)

FOREIGN PATENT DOCUMENTS

CN 111312798 A 6/2020
CN 111697037 A 9/2020
(Continued)

*Primary Examiner* — Vongsavanh Sengdara
(74) *Attorney, Agent, or Firm* — IPro, PLLC

(57) ABSTRACT

Provided in the present disclosure are a display panel and a manufacturing method therefor, and a display apparatus. A pixel defining layer includes a plurality of first barrier walls and a plurality of second barrier walls, which are arranged in an intersecting manner, where a height of the first barrier wall is smaller than a height of the second barrier wall, and orthographic projections of via holes for connecting light emitting devices on a base substrate are located in orthographic projections of the second barrier walls on the base substrate. Due to a great thickness of the second barrier walls, an effect of covering via holes can be better by providing the via holes below the second barrier walls.

17 Claims, 7 Drawing Sheets

(51) Int. Cl.
    *H10K 59/131*        (2023.01)
    *H10K 59/80*         (2023.01)

(58) Field of Classification Search
    CPC .... H10K 59/124; H10K 59/873; H10K 59/00;
                                           H10K 50/858
    See application file for complete search history.

(56)                 References Cited

U.S. PATENT DOCUMENTS

| | | | |
|---|---|---|---|
| 2021/0384272 A1* | 12/2021 | Zhang | H10K 59/40 |
| 2022/0158137 A1* | 5/2022 | Chen | H10K 59/65 |
| 2022/0165979 A1* | 5/2022 | Huang | H10K 71/60 |
| 2022/0231257 A1 | 7/2022 | Wang et al. | |
| 2022/0262889 A1* | 8/2022 | Song | H10D 86/441 |

FOREIGN PATENT DOCUMENTS

| | | | |
|---|---|---|---|
| CN | 112420959 A | 2/2021 | |
| CN | 112436044 A | 3/2021 | |
| CN | 112885879 A | 6/2021 | |
| CN | 112968045 A | 6/2021 | |

\* cited by examiner

DISPLAY PANEL AND MANUFACTURING METHOD THEREFOR, AND DISPLAY APPARATUS

CROSS REFERENCE TO RELATED APPLICATIONS

The present disclosure is a US National Stage of International Application No. PCT/CN2022/099582, filed on Jun. 17, 2022, the entire contents of which are incorporated herein by reference.

FIELD

The present disclosure relates to the technical field of display, and particularly relates to a display panel and a manufacturing method therefor, and a display apparatus.

BACKGROUND

In recent years, with sustained development of the display technology, display apparatuses have become indispensable in human-computer interaction. Existing display apparatuses primarily include an organic light emitting diode (OLED) display apparatus and a liquid crystal display (LCD) apparatus. Being thinner and lighter, more sensitive, brighter, more vivid, wide in viewing angle and power-saving, the OLED display apparatus has acquired an increasing market share.

An OLED device emits light through injection and recombination of carriers. With rapid development of the OLED display industry, demands for light emitting brightness and display effects of OLED devices keep growing. An ink-jet printing process, a critical process for manufacturing OLED display devices, can hardly satisfy demands for imaging fineness and quality of a display device due to performance limitation of devices. For example, in actual production, color mixing between adjacent sub-pixels of a display device or ink overflow caused by a low aperture ratio of sub-pixels occur frequently, which seriously restricts development of the OLED display technology.

SUMMARY

A first aspect of an embodiment of the present disclosure provides a display panel, including:

a base substrate;

a driver circuit layer on the base substrate;

a planarization layer at one side of the driver circuit layer facing away from the base substrate, where the planarization layer includes a plurality of via holes;

a pixel defining layer on the planarization layer, where the pixel defining layer includes: a plurality of first barrier walls and a plurality of second barrier walls, the plurality of first barrier walls extend in a first direction and are arranged in a second direction, and the plurality of second barrier walls extend in the second direction and are arranged in the first direction; the first direction intersects with the second direction; and the plurality of first barrier walls and the plurality of second barrier walls form a plurality of openings; and a light emitting device layer at one side of the pixel defining layer facing away from the planarization layer, where the light emitting device layer includes a plurality of light emitting devices, and one light emitting device is correspondingly arranged in one opening; and one via hole corresponds to one light emitting device, and the light emitting devices are electrically connected to the driver circuit layer through the corresponding via holes, where a height of the first barrier wall is smaller than a height of the second barrier wall, and orthographic projections of the via holes on the base substrate are located in orthographic projections of the second barrier walls on the base substrate.

In some embodiments of the present disclosure, the orthographic projections of the via holes on the base substrate are located in orthographic projections of intersection areas between the first barrier walls and the second barrier walls on the base substrate.

In some embodiments of the present disclosure, a width of the first barrier wall in the second direction is greater than a width of the second barrier wall in the first direction.

In some embodiments of the present disclosure, the display panel further includes:

a medium layer at one side of the pixel defining layer facing away from the planarization layer; and an encapsulation layer at one sides of the pixel defining layer and the light emitting device layer facing away from the planarization layer, where a refractive index of the encapsulation layer is greater than a refractive index of the medium layer.

In some embodiments of the present disclosure, the medium layer includes a plurality of medium units, and a size of the orthographic projections of the via holes on the base substrate is greater than a size of orthographic projections of the medium units on the base substrate.

In some embodiments of the present disclosure, the plurality of medium units are arranged along peripheral edges of the openings separately.

In some embodiments of the present disclosure, adjacent medium units are separated by a set distance; and the set distance is smaller than a width of the medium units.

In some embodiments of the present disclosure, the medium units at one sides of the first barrier walls facing away from the planarization layer are first medium units, and the medium units at one sides of the second barrier walls facing away from the planarization layer are second medium units; and a width of the first medium unit is equal to a width of the second medium unit.

In some embodiments of the present disclosure, a distance between two rows of first medium units located on a same first barrier wall and arranged at edges of two adjacent openings is greater than a width of the first medium unit; and a distance between two rows of second medium units located on a same second barrier wall and arranged at edges of two adjacent openings is smaller than a width of the second medium unit.

In some embodiments of the present disclosure, a distance between adjacent first medium units at an edge of a same opening is greater than a distance between adjacent second medium units.

In some embodiments of the present disclosure, a height of the first medium unit is the same as a height of the second medium unit.

In some embodiments of the present disclosure, a height of the first medium unit is greater than a height of the second medium unit; and a surface of one side of the first medium unit facing away from the first barrier wall is flush with a surface of one side of the second medium unit facing away from the second barrier wall.

In some embodiments of the present disclosure, the medium units are in a shape of one of a cylinder, a cone, or a hemisphere.

In some embodiments of the present disclosure, widths of the medium units decrease and then increase in a direction away from the pixel defining layer.

A second aspect of an embodiment of the present disclosure provides a display apparatus, which includes any one of the above display panels.

A third aspect of an embodiment of the present disclosure provides a manufacturing method for a display panel, including:

forming a driver circuit layer on a base substrate;

forming a planarization layer at one side of the driver circuit layer facing away from the base substrate, where the planarization layer includes a plurality of via holes;

forming an anode layer of a light emitting device layer on the planarization layer, where the anode layer includes a plurality of separate anodes;

forming a pixel defining layer on the planarization layer, where the pixel defining layer includes: a plurality of first barrier walls and a plurality of second barrier walls, the plurality of first barrier walls extend in a first direction and are arranged in a second direction, and the plurality of second barrier walls extend in the second direction and are arranged in the first direction; the first direction intersects with the second direction; and the plurality of first barrier walls and the plurality of second barrier walls form a plurality of openings, and one opening corresponds to one anode;

forming a medium layer at one side of the pixel defining layer facing away from the planarization layer, and forming a hole injection layer, a hole transport layer, a light emitting layer, an electron transport layer, an electron injection layer, and a cathode layer of the light emitting device layer sequentially at one sides of the anodes and the pixel defining layer facing away from the planarization layer; and alternatively, forming a hole injection layer, a hole transport layer, a light emitting layer, an electron transport layer, an electron injection layer, and a cathode layer of the light emitting device layer sequentially at one sides of the anodes and the pixel defining layer facing away from the planarization layer, and forming a medium layer at one side of the anode layer facing away from the pixel defining layer; and forming an encapsulation layer at one side of the light emitting device layer facing away from the planarization layer, where a height of the first barrier wall is smaller than a height of the second barrier wall, and orthographic projections of the via holes on the base substrate are located in orthographic projections of the second barrier walls on the base substrate; and a refractive index of the encapsulation layer is greater than a refractive index of the medium layer.

BRIEF DESCRIPTION OF THE DRAWINGS

To describe technical solutions in embodiments of the present disclosure more clearly, the accompanying drawings required in the embodiments of the present disclosure are briefly introduced below. Obviously, the accompanying drawings introduced below show merely some embodiments of the present disclosure, and those of ordinary skill in the art would also be able to derive other accompanying drawings from these accompanying drawings without creative efforts.

DETAILED DESCRIPTION OF THE EMBODIMENTS

Figure 1:
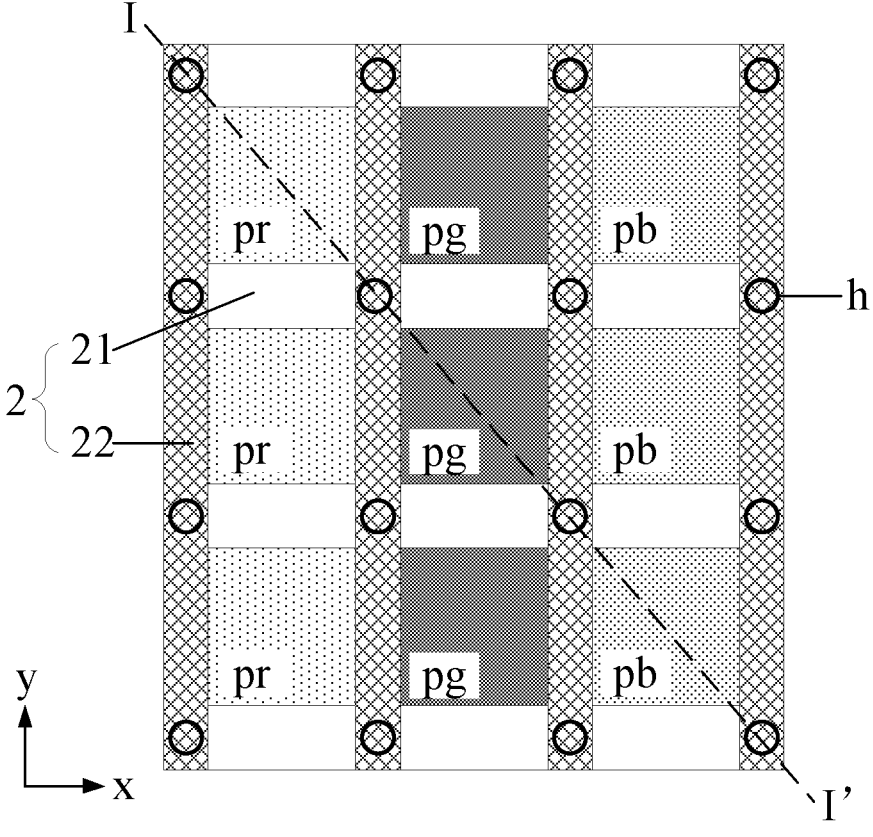
FIG. 1 is a first schematic structural diagram of a top view of a display panel according to an embodiment of the present disclosure.

To make the objectives, features, and advantages of the present disclosure clearer and more comprehensible, the present disclosure is further described below with reference to the accompanying drawings and embodiments. However, exemplary implementation modes can be implemented in many forms and should not be construed as limited to the implementation modes set forth herein. On the contrary, the implementation modes are provided to make the present disclosure thorough and complete, and to fully convey a concept of the exemplary implementation modes to those skilled in the art. In the drawings, the same reference numerals denote the same or similar parts, which will not be repeated herein. Words expressing positions and directions described in the present disclosure are all illustrated with the accompanying drawings as an example, and can be changed as required, and all the changes are included in the protection scope of the present disclosure. The accompanying drawings of the present disclosure are merely used for indicating relative position relationships instead of representing the true scales.

An organic light emitting diode (OLED) display panel is a display panel with an OLED device as a sub-pixel. As a current type light emitting device, the OLED device emits light through injection and recombination of carriers. A basic structure of the OLED device consists of anodes, cathodes, and a light emitting layer between the anodes and the cathodes. The light emitting layer is generally made of an organic light emitting material, and in order to emit light with different colors, the OLED device generally needs to be made of various organic light emitting materials. In the OLED device, under the action of an electric field, holes generated by the anodes and electrons generated by the cathodes may move and migrate to the light emitting layer, energy excitons are generated, and further light emitting molecules are excited to finally generate light with a specific color.

An ink-jet printing process, a critical process for manufacturing OLED display devices, may frequently have problems such as color mixing between adjacent pixels of a display device or ink overflow caused by a low aperture ratio of pixels due to performance limitation of devices, which seriously restricts development of the display devices. In view of this, an embodiment of the present disclosure provides a display panel, which may increase an opening area of a sub-pixel, prevent crosstalk, and improve light emitting brightness.

Figure 2:
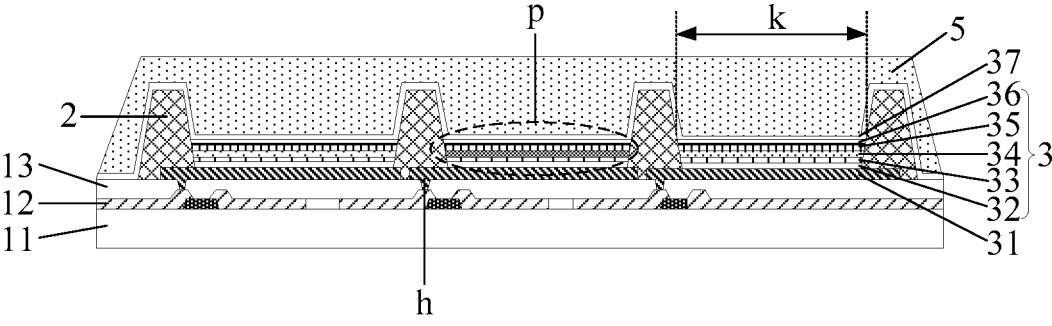
FIG. 2 is a schematic structural diagram of a section of a display panel in direction I-I' in FIG. 1.

FIG. 1 is a first schematic structural diagram of a top view of a display panel according to an embodiment of the present disclosure. FIG. 2 is a schematic structural diagram of a section of a display panel in direction I-I' in FIG. 1.

As shown in FIG. 1 and FIG. 2, the display panel provided in the embodiment of the present disclosure includes: a base substrate 11, a driver circuit layer 12, a planarization layer 13, a pixel defining layer 2, a light emitting device layer 3, and an encapsulation layer 5. The light emitting device layer 3 includes a plurality of light emitting devices p.

The base substrate 11 has functions of supporting and bearing. The base substrate is generally a glass substrate. When being applied to a flexible display apparatus, the base substrate 11 may also use a flexible substrate, which is not limited herein.

The driver circuit layer 12 is located on the base substrate 11. The driver circuit layer 12 includes a plurality of pixel circuits, and one pixel circuit is connected to one light emitting device p, so as to control the light emitting device p to emit light. The driver circuit layer 12 includes a plurality of thin film transistors (TFT), capacitors, resistors, and other elements, and is generally manufactured through a thin film process.

The planarization layer 13 is located at one side of the driver circuit layer 12 facing away from the base substrate 11. The planarization layer 13 covers a surface of the driver circuit layer 12 so as to insulate and protect a circuit and planarize the surface. The planarization layer 13 may be made of inorganic materials such as silicon oxide and silicon nitride, or organic materials, which are not limited herein.

Figure 3:
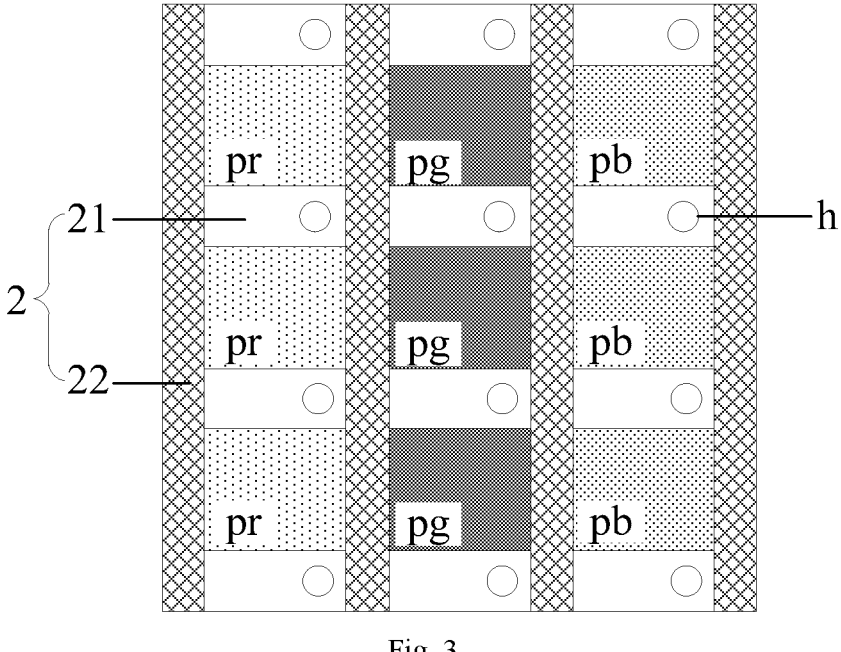
FIG. 3 is a schematic structural diagram of a top view of a display panel in the related art.

As shown in FIG. 3, the planarization layer 13 includes a plurality of via holes h. One via hole h corresponds to one light emitting device p, and the light emitting devices p are electrically connected to the driver circuit layer 12 through the corresponding via holes h.

The pixel defining layer 2 is located on the planarization layer 13, and the pixel defining layer 2 is configured to limit positions of sub-pixels, that is, to limit positions of the light emitting devices p. The pixel defining layer 2 includes a plurality of openings k, and one light emitting device p is correspondingly arranged in one opening k.

The pixel defining layer 2 generally has a great thickness. The plurality of openings k are formed through an etching process, and further functional film layers of the light emitting devices are formed in the openings.

The light emitting device layer 3 is located at one side of the pixel defining layer 2 facing away from the planarization layer 13, and the light emitting device layer 3 includes the plurality of light emitting devices p.

In some embodiments, the light emitting devices p are organic light emitting diode (OLED) devices. Specifically, as shown in FIG. 2, the light emitting device layer 3 includes: an anode layer 31, a hole injection layer 32, a hole transport layer 33, a light emitting layer 34, an electron transport layer 35, an electron injection layer 36, and a cathode layer 37.

The anode layer 31 is located on the planarization layer 13. The anode layer 31 includes a plurality of separate anodes. One anode corresponds to one via hole h, and the anodes are electrically connected to the driver circuit layer 12 through the corresponding via holes h. The anode layer 31 is made of indium tin oxide (ITO) or other materials. Specifically, a whole transparent conductive material layer may be formed on a surface of the planarization layer 13, and then patterns of the anodes may be formed through an etching process.

The openings k of the pixel defining layer 2 are in one-to-one correspondence to the anodes, the pixel defining layer 2 covers edges of the anodes, and each opening k exposes the corresponding anode. Each anode corresponds to one via hole h of the planarization layer, the driver circuit layer 12 includes a plurality of driver transistors, and each anode is connected to the corresponding driver transistor through the corresponding via hole h.

The hole injection layer 32 is located at one side of the anodes facing away from the planarization layer 13. The hole injection layer 32 is configured to provide holes for the OLED device and increase stability of the device. The hole injection layer 32 may be made of polymer materials such as poly(3,4-ethylenedioxythiophene)-poly(styrene sulfonic acid) (PEDOT:PSS) and polyaniline, or metal oxide materials such as molybdenum trioxide ($MoO_3$) and tungsten trioxide ($WO_3$), which are not limited herein.

The hole transport layer 33 is located at one side of the hole injection layer 32 facing away from the anodes. The hole transport layer 33 may improve hole transport capability of the OLED device and facilitate carrier transport to the light emitting layer. In addition, the hole transport layer 33 further has a function of blocking electrons, and may balance transport of carriers, which is conducive to improvement in device efficiency. The hole transport layer 33 may be made of tertiary aromatic amine N,N'-diphenyl-N,N'-bis(3-methylphenyl)-1,1'-biphenyl-4,4'-diamine (TPD), N,N'-diphenyl-N,N'-(1-naphthyl)-1,1'-biphenyl-4,4'-diamine (NPB), 4,4'-bis(9-carbazole)biphenyl (CBP), or isoindole materials, which are not limited herein.

The light emitting layer 34 is located at one side of the hole transport layer 33 facing away from the hole injection layer 32. In the OLED device, the light emitting layer 34 is made of an organic light emitting material. An OLED display panel requires three types of OLED devices for emitting light with three primary colors, such that materials of light emitting layers used in different OLED devices are different.

The electron transport layer 35 is located at one side of the light emitting layer 34 facing away from the hole transport layer 33. The electron transport layer 35 is configured to transport electrons, which facilitates carrier transport to the light emitting layer and improves device efficiency. The electron transport layer 35 may be made of 8-hydroxyquinoline aluminum ($Alq_3$), 2-(4-biphenyl)-5-(4-tertiary-butylphenyl)-1,3,4-oxadiazole (PBD), 1,3,5-tris(1-phenyl-1H-benzimidazole-2-yl)benzene (TPBi), or other materials, which are not limited herein.

The electron injection layer 36 is located at one side of the electron transport layer 35 facing away from the light emitting layer 34. The electron injection layer 36 is configured to provide electrons for the OLED device and increase stability of the device. The electron injection layer 36 may be made of lithium fluoride (LiF), sodium fluoride (NaF), cesium fluoride (CsF), calcium (Ca), barium (Ba), or other materials, which are not limited herein.

The cathode layer 37 is located at one side of the electron injection layer 36 facing away from the electron transport layer 35. The cathode 37 is generally manufactured in an entire-layer manner, and may be made of silver (Ag) or other materials, which are not limited herein. As shown in FIG. 2, the display panel further includes: the encapsulation layer 5 located at one side of the pixel defining layer 2 and the light emitting device layer 3 facing away from the planarization layer 13. In order to prolong service life of the light emitting devices, water and oxygen need to be blocked. The encapsulation layer covers all the light emitting devices and film layers, such that paths of water and oxygen entering the light emitting devices may be increased, and further water and oxygen may be blocked.

In the embodiment of the present disclosure, the encapsulation layer 5 may use thin-film encapsulation (TFE), and the TFE generally includes a plurality of inorganic layers and organic layers, which are stacked alternately, where a layer closest to the light emitting devices and an outermost layer use inorganic layers for blocking water and oxygen; and an organic layer is arranged between adjacent inorganic layers, so as to reduce stress.

Optionally; an outermost surface of one side of the encapsulation layer 5 facing away from the base substrate may be set to be planar, which is conducive to the continuous formation of other film layers, such as a touch functional layer, on the encapsulation layer 5.

Optionally, when a thin film layer is used as the encapsulation layer 5 so as to cover a surface of the light emitting device layer, the outermost surface of one side of the encapsulation layer 5 facing away from the base substrate may have the same pattern as the light emitting device layer and the pixel defining layer, which is not limited herein.

In the embodiment of the present disclosure, as shown in FIG. 1, the pixel defining layer 2 includes: a plurality of first barrier walls 21 and a plurality of second barrier walls 22. The plurality of first barrier walls 21 extend in a first direction x and are arranged in a second direction y; and the plurality of second barrier walls 22 extend in the second direction y and are arranged in the first direction x. The first direction x intersects with the second direction y. During specific implementation, the first direction x may be a sub-pixel row direction, and the second direction y may be a sub-pixel column direction; and alternatively, the first direction x may be a sub-pixel column direction, and the second direction y may be a sub-pixel row direction.

In order to reduce cost of manufacturing the display panel, in the embodiment of the present disclosure, a height of the first barrier wall 21 is set to be smaller than a height of the second barrier wall 22, and surface treatment is conducted on the first barrier walls 21 and the second barrier walls 22, such that the first barrier walls 21 are lyophilic, and the second barrier walls 22 are lyophobic. In this way, functional layers and light emitting layers of the light emitting devices may be manufactured in the second direction through an ink-jet printing process.

Specifically, as shown in FIG. 2, the light emitting devices include: red light emitting devices pr, green light emitting devices pg, and blue light emitting devices pb. The plurality of red light emitting devices pr are arranged into a plurality of red light emitting device columns in the second direction y; the plurality of green light emitting devices pg are arranged into a plurality of green light emitting device columns in the second direction y; the plurality of blue light emitting devices pb are arranged into a plurality of blue light emitting device columns in the second direction y; and the plurality of red light emitting device columns, the plurality of green light emitting device columns and the plurality of blue light emitting device columns are arranged in a set order in the first direction x.

In the embodiment of the present disclosure, the hole injection layers 32, the hole transport layers 33 and the light emitting layers 34 of the light emitting devices may be manufactured through a linear ink-jet printing process, and the electron transport layers 35, the electron injection layers 36 and the cathode layers 37 may be manufactured through an entire-surface evaporation process, such that cost is greatly reduced.

When the hole injection layers 32, the hole transport layers 33 and the light emitting layers 34 are manufactured, ink of corresponding materials may be jet-printed on the respective openings k and the respective first barrier walls 21 in the second direction y. The height of the first barrier wall 21 is smaller than the height of the second barrier wall 22, the first barrier walls 21 are lyophilic, and the second barrier walls 22 are lyophobic, such that the ink may only cover surfaces of the first barrier walls 21 during ink-jet printing, so as to connect the ink on the same side into a whole without causing color crosstalk by crossing the second barrier walls 22.

The electron transport layer 35, the electron injection layer 36, and the cathode layer 37 may be manufactured through entire-surface evaporation. The electron transport layer 35, the electron injection layer 36, and the cathode layer 37 sequentially cover a film layer in the opening k, a film layer on a surface of the first barrier wall 21, and a surface of the second barrier wall 22. A manufacturing process requires no high-cost fine masks, such that manufacturing cost is reduced while the process is simplified.

FIG. 3 is a schematic structural diagram of a top view of a display panel in the related art.

As shown in FIG. 3, in the related art, the via holes h connecting the anodes of the light emitting devices are generally provided under the first barrier walls 21. The via holes h need to be provided under the first barrier walls 21, and further the first barrier walls 21 generally have a great width, such that an area of the openings k is limited, an aperture ratio of a sub-pixel is low; and then problems such as printing ink overflow are prone to occurrence.

In the embodiment of the present disclosure, as shown in FIG. 2, the via holes h are provided under the second barrier walls 22, and orthographic projections of the via holes h on the base substrate are located in orthographic projections of the second barrier walls 22 on the base substrate. A thickness of the second barrier walls 22 is greater than a thickness of the first barrier walls 21, such that an effect of covering the via holes h may be better by providing the via holes h below the second barrier walls 22. In addition, the via holes h are provided below the second barrier walls 22, such that a width of the opening k in the second direction y may be appropriately increased, and further an opening area of the sub-pixel may be increased, so as to improve brightness of the sub-pixel.

Optionally, as shown in FIG. 1, the via holes h may be provided in intersection areas between the respective first barrier walls 21 and the respective second barrier walls 22, and the orthographic projections of the via holes h on the base substrate are located in orthographic projections of intersection areas between the first barrier walls 21 and the second barrier walls 22 on the base substrate.

Figure 4:
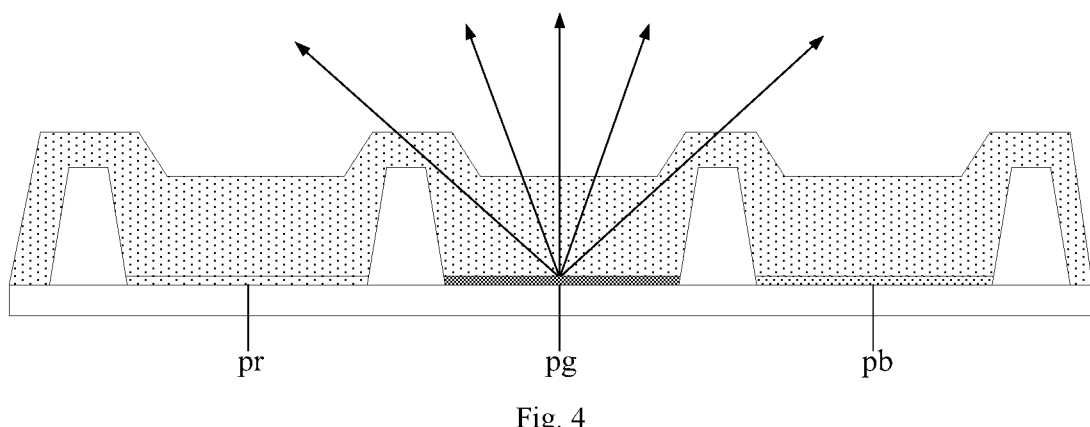
FIG. 4 is a schematic diagram of emergent rays of an organic light emitting diode (OLED) device in the related art.

FIG. 4 is a schematic diagram of emergent rays of an OLED device in the related art.

As shown in FIG. 4, the display panel generally includes red OLED devices pr, green OLED devices pg, and blue OLED devices pb which are arranged in an array. Due to characteristics of a light emitting mechanism of the OLED device, angles of the emergent rays of the OLED device are random, such that a large-angle light ray emitted from the OLED device is emitted to an adjacent OLED device so as to cause color crosstalk, and further extraction efficiency of light directly above the device is low;

In view of this, in the embodiment of the present disclosure, a medium layer 4 is arranged in the display panel, such that the light ray is totally reflected by an interface between the encapsulation layer and the medium layer, and light emitting efficiency of a portion directly above the light emitting device is improved.

Figure 5:
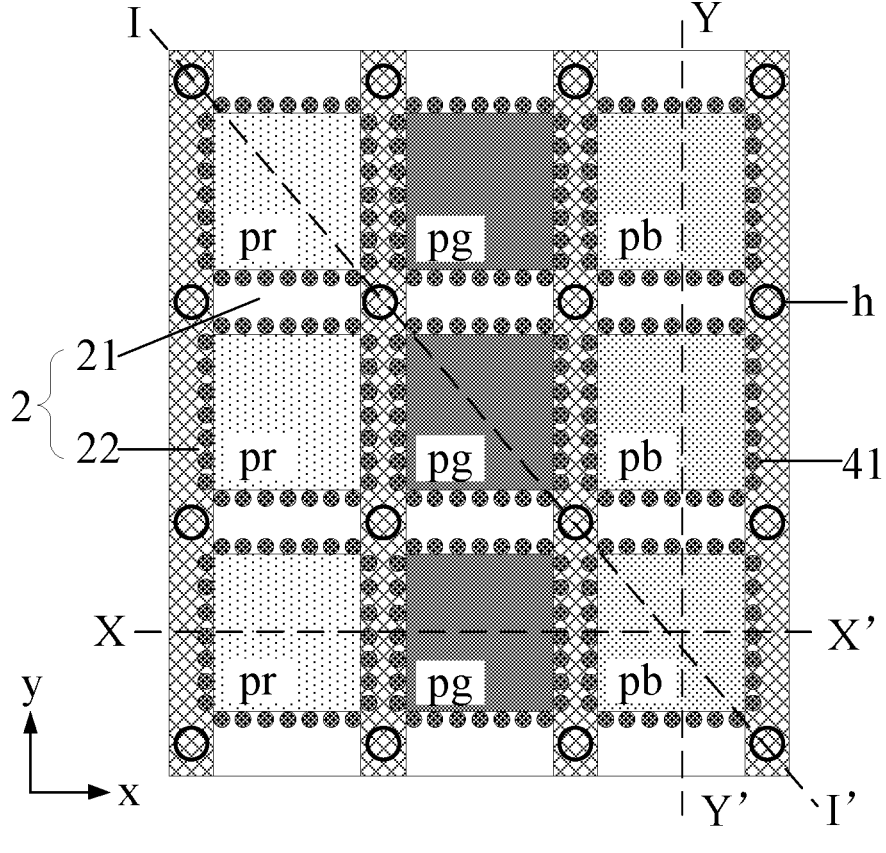
FIG. 5 is a second schematic structural diagram of a top view of a display panel according to an embodiment of the present disclosure.
Figure 6:
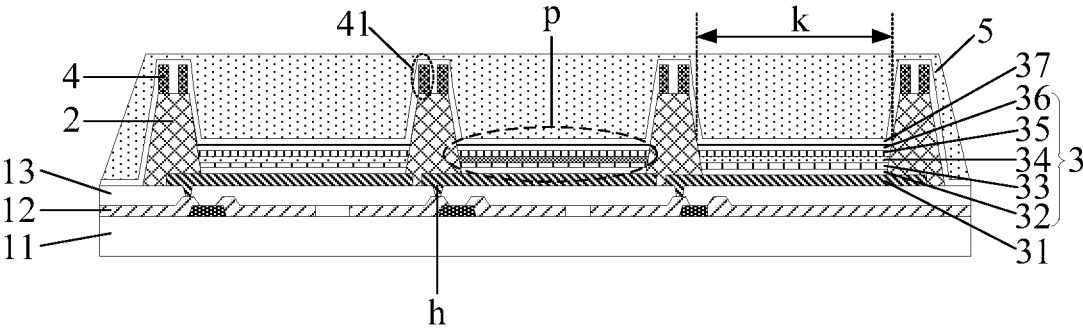
FIG. 6 is a schematic structural diagram of a section of a display panel in direction I-I' in FIG. 5.
Figure 7:
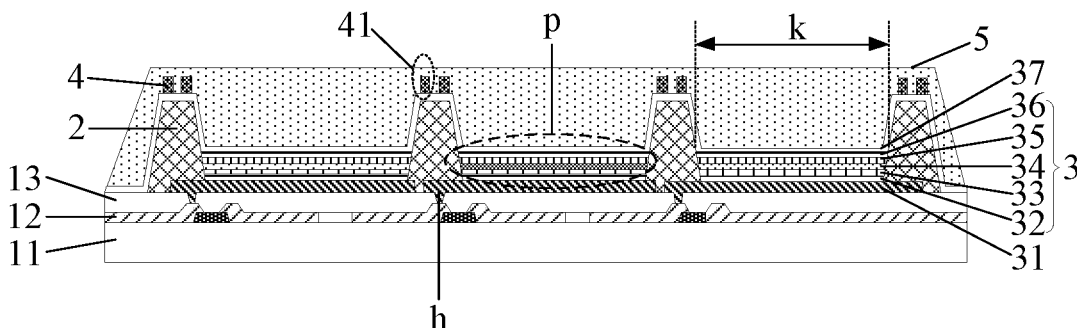
FIG. 7 is a schematic structural diagram of a section of another display panel according to an embodiment of the present disclosure.

FIG. 5 is a second schematic structural diagram of a top view of a display panel according to an embodiment of the present disclosure. FIG. 6 is a schematic structural diagram of a section of a display panel in direction I-I' in FIG. 5. FIG. 7 is a schematic structural diagram of a section of another display panel according to an embodiment of the present disclosure.

As shown in FIGS. 5 and 6, in the embodiment of the present disclosure, the display panel further includes the medium layer 4. The medium layer 4 is located at one side of the pixel defining layer 2 facing away from the planarization layer 13.

In the embodiment of the present disclosure, the medium layer 4 includes a plurality of medium units 41, and the medium units 41 may have a function of totally reflecting incident light rays by selecting a material with an appropriate refractive index to manufacture the medium units 41.

Generally, due to a great thickness of the encapsulation layer 5, an emergent ray of the light emitting device may pass the encapsulation layer 5 and then be incident on the medium unit 41. In order to satisfy a total reflection requirement, a refractive index of the encapsulation layer 5 needs to be greater than a refractive index of the medium layer 4, such that a condition that a light ray may enter an optically thinner medium from an optically denser medium is satisfied. In practical application, a refractive index of the TFE is about 1.8. Therefore, in the embodiment of the present disclosure, a refractive index of the medium layer 4 is smaller than 1.8, and the greater a refractive index difference between the medium layer 4 and the encapsulation layer 5 is, the smaller a critical angle for total reflection is. During specific implementation, an appropriate material of the medium layer may be selected according to an angle of a light ray emitted from the light emitting device to the edge.

In the embodiment of the present disclosure, the medium layer 4 may be made of acrylic materials. The materials such as photosensitive groups, catalytic groups, surfactants, etc., are generally added to the acrylic materials, which is conducive to improvement in optical performance of the medium layer 4.

In some embodiments, as shown in FIG. 6, the medium layer 4 may be arranged on a surface of the pixel defining layer 2, and the cathode layer 37 in the light emitting device covers the medium layer during manufacturing. Because a functional film layer of the light emitting device generally has a small thickness, which is generally sized in nanometer, an optical path generated by the functional film layer may be ignored, and the medium layer 4 may totally reflect incident light when the refractive index of the encapsulation layer is ensured to be greater than the refractive index of the medium layer 4.

In some embodiments, as shown in FIG. 7, the medium layer 4 may also be arranged on the cathode layer 37 of the light emitting device, such that the functional layer of the light emitting device may be prevented from being cut by the medium layer 4 when being manufactured, the encapsulation layer 5 may further make direct contact with the medium layer 4, and total reflection occurs at the interface between the encapsulation layer 5 and the medium layer 4.

Figure 8:
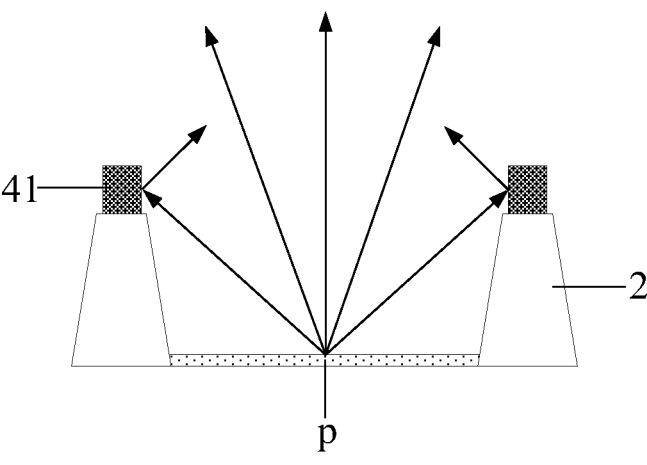
FIG. 8 is a first schematic diagram of emergent rays of an OLED device according to an embodiment of the present disclosure.

FIG. 8 is a first schematic diagram of emergent rays of a light emitting device according to an embodiment of the present disclosure.

As shown in FIG. 8, after the plurality of medium units 41 are arranged on the pixel defining layer 2, large-angle light rays emitted from the light emitting devices p to the edge are totally reflected when being incident on the medium units 41, such that the light rays are converged back to avoid color crosstalk, and meanwhile, extraction efficiency of light rays directly above the light emitting devices p is increased, and light emitting performance of the device is improved.

As shown in FIG. 4, the medium units 41 in the medium layer 4 are arranged along peripheral edges of the openings k separately, such that the light rays emitted from the light emitting devices p to the peripheral edges may be reflected back by the medium units 41, and further the extraction efficiency of light directly above the light emitting devices is improved.

The medium units 41 generally need to be separated by a set distance, so as to reduce a filling rate of the medium units 41, such that the refractive index change continuously when the light is incident on the medium layer 4, and further an incident angle of a light ray has a certain change, which is conducive to total reflection of the incident light.

During specific implementation, the medium units 41 are generally sized in micrometer, and the medium units 41 have an appropriate size according to resolution of the display panel. For example, a distance between two adjacent light emitting devices of a current display panel is about 15 µm-50 µm, such that a width of the medium unit 41 parallel to the base substrate may be 4 µm-10 µm. A specific value of the width of the medium unit 41 is not limited in the embodiment of the present disclosure. A set distance between the adjacent medium units 41 is smaller than the width of the medium unit 41, and for example, the set distance between the adjacent medium units 41 is 1 µm-3 µm. A specific value of the distance between the medium units 41 is not limited in the embodiment of the present disclosure.

During specific implementation, the medium units 41 may be set to be in a shape of at least one of a cylinder, a cone, or a hemisphere. With FIGS. 6 and 7 as examples, the medium units 41 may be set to be in the shape of the cylinder, and the cylinder may be a circular cylinder or prism, which is not limited herein. The medium units 41 are separated by the set distance and evenly distributed at the peripheral edges of the openings k. In addition, the medium units 41 may be set to be in the shape of the cone, such as a circular cone, a pyramid, a circular truncated cone, a pyramid, etc.

Figure 9:
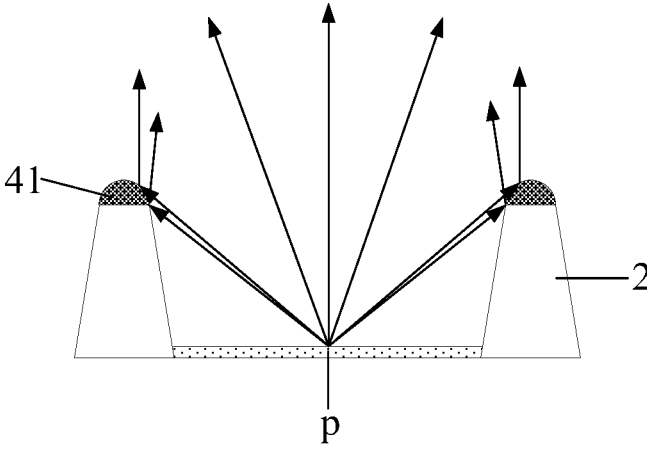
FIG. 9 is a second schematic diagram of emergent rays of an OLED device according to an embodiment of the present disclosure.
Figure 10:
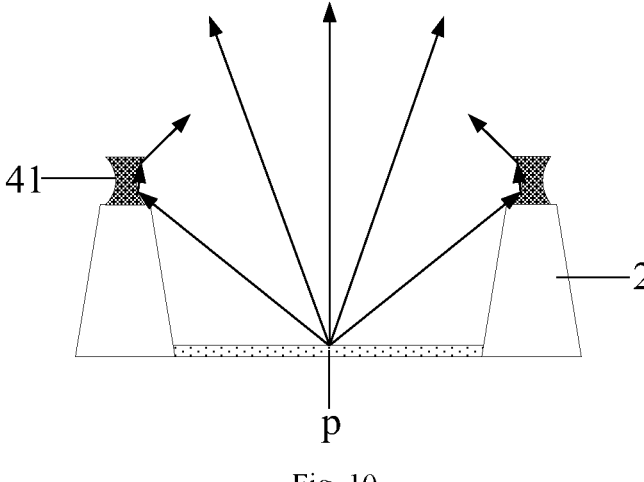
FIG. 10 is a third schematic diagram of emergent rays of an OLED device according to an embodiment of the present disclosure.

FIG. 9 is a second schematic diagram of emergent rays of a light emitting device according to an embodiment of the present disclosure. FIG. 10 is a third schematic diagram of emergent rays of a light emitting device according to an embodiment of the present disclosure.

Optionally, as shown in FIG. 9, the medium units 41 may also be set to be in the shape of the hemisphere, such that a height of the medium unit 41 is a radius of the hemisphere, and a width of the medium unit 41 is a diameter of the hemisphere. The medium units 41 are set to be in the shape of the hemisphere, such that a total reflection effect of the medium units 41 on incident light may be optimized by using a characteristic that an incident angle changes when a light ray is incident on different positions of a surface of the hemisphere. According to simulation results of medium units 41 having different shapes, a better effect is achieved by setting the medium units 41 to be in the shape of the hemisphere.

Optionally, as shown in FIG. 10, the medium unit 41 may also be set to have a special-shaped cylinder structure, and a width of the medium unit 41 has a changing trend of decreasing and then increasing in a direction away from the pixel defining layer 2 (that is, an upward vertical direction in FIG. 10). That is, a width between two ends of the medium unit 41 is greater than a width between middle positions of the medium unit 41. In this way, when being incident on the surface of the medium unit 41, the light ray tends to be reflected along a side wall of the medium unit 41, such that light rays emitted from the light emitting device p may be finally converged at a position directly above the device, which is conducive to improvement in extraction efficiency of light directly above the light emitting device.

In the embodiment of the present disclosure, the medium units 41 need to be arranged at the edges of the respective openings k on the pixel defining layer. In order to avoid influence on the via holes h when the medium units 41 are manufactured and to avoid insufficient stress at positions of the via holes h, in the embodiment of the present disclosure, the via holes h are provided under the second barrier walls 22.

Optionally, no medium units 41 need to be arranged at intersection positions of the first barrier walls 21 and the second barrier walls 22, such the influence of the medium units 41 on the via holes h and the anodes may be avoided to the greatest extent by providing the via holes h at the positions.

Figure 11:
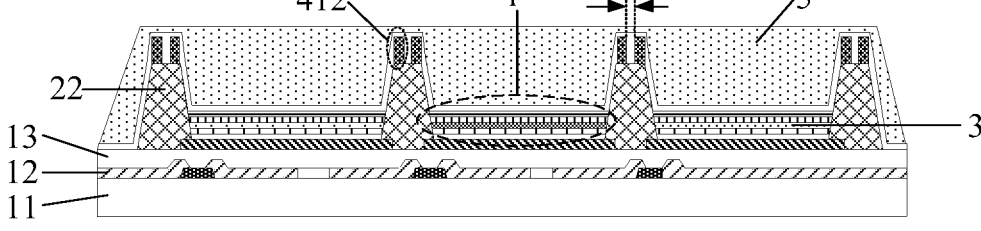
FIG. 11 is a schematic structural diagram of a section of a display panel in direction X-X' in FIG. 5.
Figure 12:
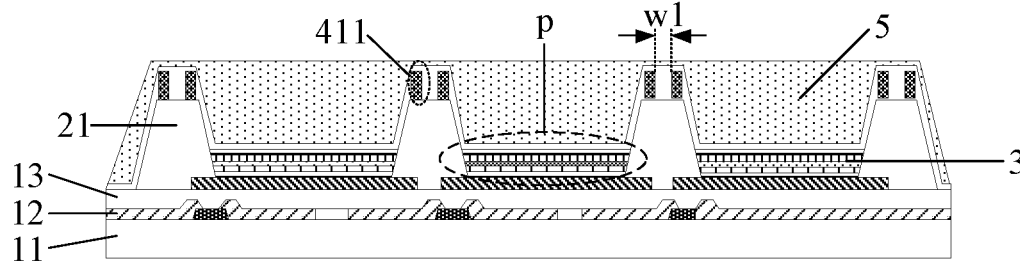
FIG. 12 is a schematic structural diagram of a section of a display panel in direction Y-Y' in FIG. 5.

In some embodiments of the present disclosure, a width of the orthographic projection of the via hole h on the base substrate is greater than a width of orthographic projection of the medium unit 41 on the base substrate. Due to a small width of the medium unit 41, the medium unit 41 may be arranged at the edge of the opening k, so as to converge light ray. Due to a small size, the medium unit 41 does not need to occupy a large space, such that a width of the first barrier wall 21 may be appropriately reduced, so as to increase a width of the opening k in the second direction y, a width of the anode in the second direction y is increased, and the opening area of the sub-pixel is increased. FIG. 11 is a schematic structural diagram of a section of a display panel in direction X-X' in FIG. 5. FIG. 12 is a schematic structural diagram of a section of a display panel in direction Y-Y' in FIG. 5.

As shown in FIGS. 11 and 12, when the pixel defining layer is manufactured, a height of a first barrier wall 21 is different from a height of a second barrier wall 22, and a width of the first barrier wall may be the same as a width of the second barrier wall or not. In the embodiments of the present disclosure, the width of the first barrier wall 21 is greater than the width of the second barrier wall 22, and the height of the first barrier wall 21 is smaller than the height of the second barrier wall 22. The first barrier walls 21 are lyophilic, and the second barrier walls 22 are lyophobic. The second barrier walls 22 are set to have a great thickness and a small width, such that the ink of the light emitting layer is prevented from crossing the second barrier walls 22 to the adjacent opening during ink-jet printing of the light emitting layer. The first barrier walls 21 are set to have a small thickness and a great width, such that ink may spread in the second direction y during ink-jet printing of the hole injection layer, the hole transport layer and the light emitting layer, with a relatively even thickness.

In the embodiments of the present disclosure, medium units on the first barrier walls 21 are called first medium units 411, and medium units on the second barrier walls 22 are called second medium units 412. It may be seen from FIG. 4 that the medium units are arranged at the edges of the openings k. For one opening (i.e., a sub-pixel), second barrier walls 22 at two sides of the opening in the first direction x are each provided with one row of second medium units 412, and first barrier walls 21 at two sides of the opening in the second direction y are each provided with one row of first medium units 411. In this way, the same first barrier wall 21 may be provided with two rows of first medium units 411, and the same second barrier wall 22 may be provided with two rows of second medium units 412. The width of the first barrier wall 21 is greater than the width of the second barrier wall 22, such that a distance w1 between two rows of first medium units 411 located on the same first barrier wall 21 and arranged at edges of two adjacent openings is greater than a distance w2 between two rows of second medium units 412 located on the same second barrier wall 22 and arranged at edges of two adjacent openings. The distance w1 between the two rows of first medium units 411 on the first barrier wall 21 may be greater than the width of the first medium unit 411; and the distance w2 between the two rows of second medium units 412 on the second barrier wall 22 may be smaller than the width of the second medium unit 412.

During specific implementation, the width of the first barrier wall 21 is 35 μm-50 μm, and the width of the second barrier wall 22 is about 15 μm-20 μm. The width of the medium unit 41 is generally 4 μm-10 μm, such that the distance between the two rows of first medium units 411 on the first barrier wall 21 may be increased to reduce process difficulty.

As shown in FIG. 2, in the first direction x, the light emitting devices at two sides of each second barrier wall 22 have different colors; and in the second direction y, the light emitting devices at two sides of each first barrier wall 21 have the same color. Color crosstalk between sub-pixels mainly exists between light emitting devices having different colors. Therefore, in the embodiments of the present disclosure, a distance between the two adjacent first medium units 411 at an edge of the same opening is greater than a distance between the two adjacent second medium units 412. A density of the first medium units 411 is set to be smaller than a density of the second medium units 412, such that the first medium units 411 are relatively sparse and the second medium units 412 are relatively dense. In this way, the total reflection effect of the second medium units 412 on the incident light is increased so as to avoid color crosstalk. The process difficulty may be reduced accordingly by reducing an arrangement density of the first medium units 411.

The height of the first barrier wall 21 is different from the height of the second barrier wall 22, such that the heights of the first medium units 411 and the second medium units 412 may be set to be the same when the medium units 41 are manufactured. For example, the heights of the first medium units 411 and the second medium units 412 may be set as 2

µm-5 µm. The height of the first medium unit 411 is the same as the height of the second medium unit 412, such that a height difference between the first barrier walls and the second barrier walls may be maintained, and further color crosstalk caused by ink crossing the second barrier wall during inkjet printing may be avoided.

Alternatively, the heights of the first medium units 411 may be increased, such that surfaces of one sides of the first medium units 411 and the second medium units 412 facing away from the pixel defining layer are flush with each other. It should be noted that the flush in the embodiments of the present disclosure means that upper surfaces of the first medium units 411 and the second medium units 412 are basically in the same plane. During manufacturing, a height difference between the first barrier walls 21 and the second barrier walls 22 is about 0.2 µm-1.2 µm, such that the height of the second medium unit 412 may be 2 µm-5 µm. In order to compensate the height difference between the first barrier walls and the second barrier walls, the height of the first medium unit 411 may be 2.2 µm-6.2 µm. The upper surfaces of the first medium units 411 and the second medium units 412 are flush with each other, such that the light rays emitted from the light emitting devices to peripheral edges may be totally reflected, with the same total reflection effect.

Based on the same inventive concept, an embodiment of the present disclosure further provides a display apparatus. The display apparatus includes any one of the display panels. The display apparatus may be an OLED display screen, an OLED display, an OLED television, or another display apparatus, or a mobile phone, a tablet computer, a smart photo album, or another mobile device. A problem solving principle of the display apparatus is similar to a problem solving principle of the display panel, so reference may be made to implementation of the display panel for implementation of the display apparatus, which will not be repeated herein.

Figure 13:
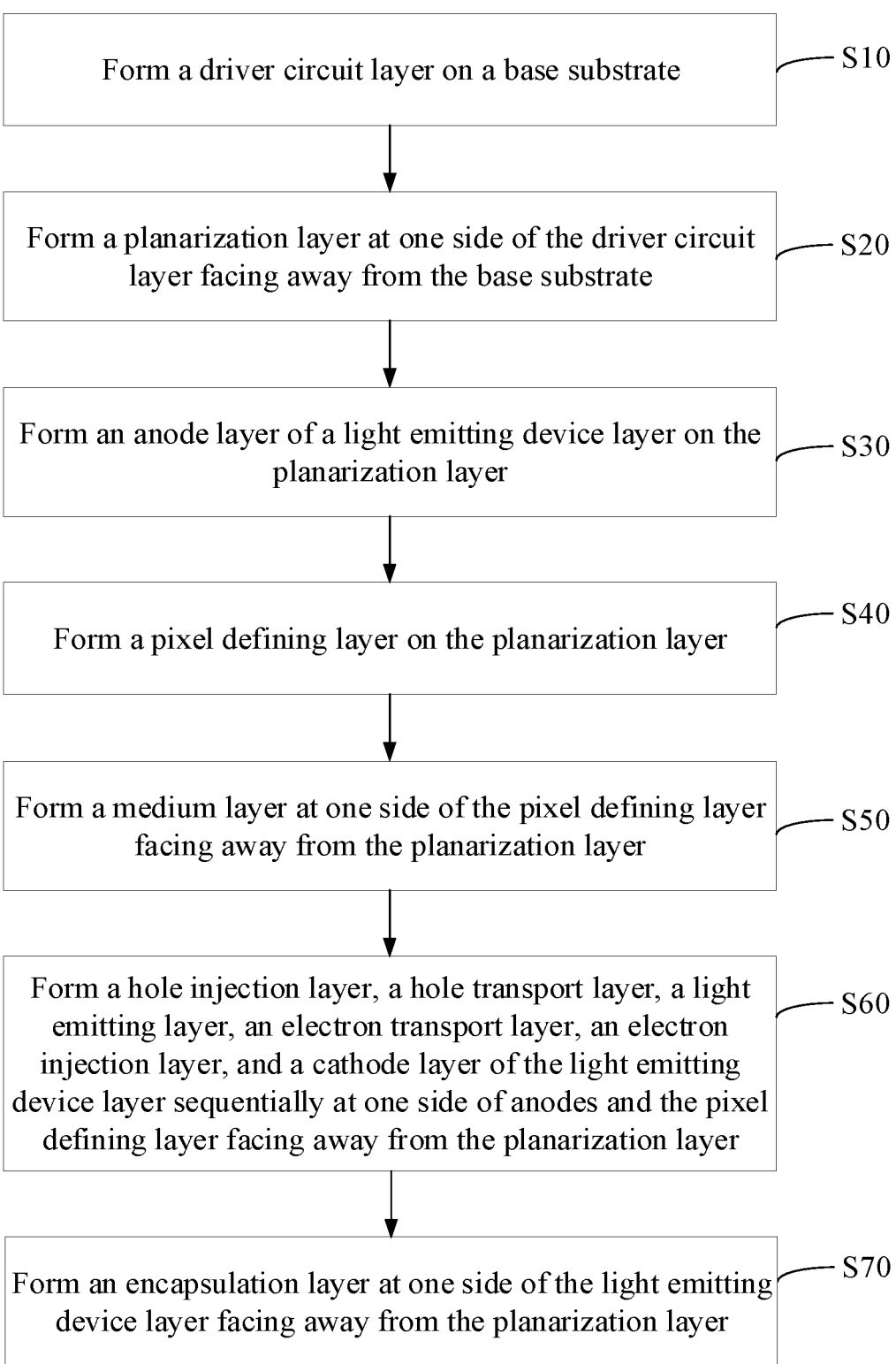
FIG. 13 is a first flow diagram of a manufacturing method for a display panel according to an embodiment of the present disclosure.
Figure 14:
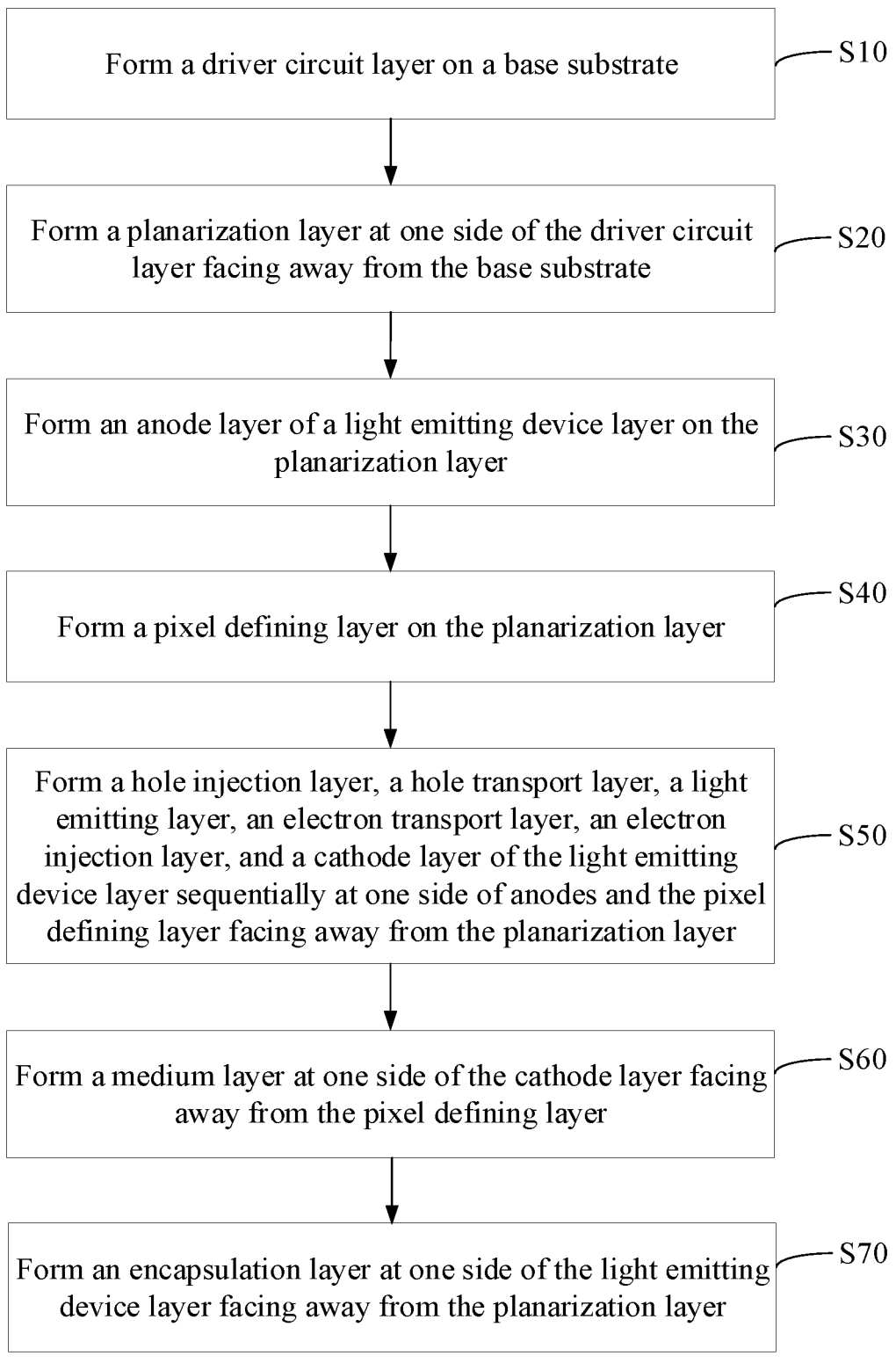
FIG. 14 is a second flow diagram of a manufacturing method for a display panel according to an embodiment of the present disclosure.

Another aspect of an embodiment of the present disclosure provides a manufacturing method for a display panel. FIG. 13 is a first flow diagram of a manufacturing method for a display panel according to an embodiment of the present disclosure. FIG. 14 is a second flow diagram of a manufacturing method for a display panel according to an embodiment of the present disclosure.

As shown in FIG. 13, the manufacturing method for a display panel provided in the embodiment of the present disclosure includes S10 to S70.

S10, a driver circuit layer is formed on a base substrate.

S20, a planarization layer is formed at one side of the driver circuit layer facing away from the base substrate.

S30, an anode layer of a light emitting device layer is formed on the planarization layer.

S40, a pixel defining layer is formed on the planarization layer.

S50, a medium layer is formed at one side of the pixel defining layer facing away from the planarization layer.

S60, a hole injection layer, a hole transport layer, a light emitting layer, an electron transport layer, an electron injection layer, and a cathode layer of the light emitting device layer are sequentially formed at one side of anodes and the pixel defining layer facing away from the planarization layer.

S70, an encapsulation layer is formed at one side of the light emitting device layer facing away from the planarization layer.

As shown in FIG. 14, the manufacturing method for a display panel provided in the embodiment of the present disclosure includes S10 to S70.

S10, a driver circuit layer is formed on a base substrate.

S20, a planarization layer is formed at one side of the driver circuit layer facing away from the base substrate.

S30, an anode layer of a light emitting device layer is formed on the planarization layer.

S40, a pixel defining layer is formed on the planarization layer.

S50, a hole injection layer, a hole transport layer, a light emitting layer, an electron transport layer, an electron injection layer, and a cathode layer of the light emitting device layer are sequentially formed at one side of anodes and the pixel defining layer facing away from the planarization layer.

S60, a medium layer is formed at one side of the cathode layer facing away from the pixel defining layer.

S70, an encapsulation layer is formed at one side of the light emitting device layer facing away from the planarization layer.

Light emitting devices are OLED devices, the anode layer includes a plurality of separate anodes, the anodes define positions of the light emitting devices, the pixel defining layer includes a plurality of openings for exposing the anodes, and one opening corresponds to one anode. One anode and a hole injection layer, a hole transport layer, a light emitting layer, an electron transport layer, an electron injection layer and a cathode layer corresponding to a position of the anode constitutes one light emitting device. The medium layer includes a plurality of medium units, and the medium units are configured to totally reflect incident light. Large-angle light rays emitted from the light emitting devices to an edge are totally reflected when being incident on the medium units, such that the light rays are converged back to avoid color crosstalk, and meanwhile, extraction efficiency of light rays directly above the light emitting devices is increased, and light emitting performance of the device is improved.

Specifically, reference may be made to a manufacturing process for an array substrate in an OLED display panel in the related art for a manufacturing method for the driver circuit layer and the planarization layer, which will not be repeated herein. The planarization layer is provided with a plurality of via holes for exposing the driver circuit layer, and the via holes are configured to connect the anodes of the light emitting devices, such that the light emitting devices are driven by a driver circuit.

Patterns of the anodes are formed on a surface of the planarization layer. Specifically, a whole transparent conductive material layer may be formed on the planarization layer, and then the patterns of the anodes may be formed through an etching process. The anode layer may be made of indium tin oxide (ITO) or other materials.

Then, a pattern of the pixel defining layer is formed on the planarization layer. The pixel defining layer in the embodiment of the present disclosure consists of first barrier walls having a small thickness and second barrier walls having a great thickness. In some embodiments, a whole layer of material of the first barrier walls may be formed, and a plurality of patterns of the first barrier walls may be formed through etching; and then a whole layer of material of the second barrier walls may be formed, and a plurality of patterns of the second barrier walls are formed through etching, such that a double-layer barrier wall structure is formed. In some embodiments, a material of the whole pixel defining layer may be formed, and then a halftone mask exposure technology is used to form the first barrier walls and the second barrier walls having different heights.

A material of the pixel defining layer may be polyimide or polymethyl methacrylate, and a lyophobic component is added to the material, such that the first barrier walls may be lyophilic and the second barrier walls may be lyophobic after exposure and development. The first barrier walls and the second barrier walls are arranged around edges of the anodes, and the second barrier walls cover the via holes. The first barrier walls and the second barrier walls form a plurality of openings, and each opening exposes one anode.

A pattern of the medium layer is formed on the pixel defining layer. The medium layer may be made of acrylic materials, and patterns of medium units in the medium layer may be formed through any one of a photoresist hot melting method, a chemical vapor deposition method, or an inkjet printing method.

Then, the hole injection layer is ink-jet printed in an extension direction of the second barrier wall, such that ink of the hole injection layer is formed on surfaces of all the openings and the first barrier wall without crossing the second barrier wall. The hole injection layer may be made of polymer materials such as poly(3,4-ethylenedioxy thiophene)-poly(styrene sulfonic acid) (PEDOT:PSS) and polyaniline, or metal oxide materials such as molybdenum trioxide ($MoO_3$) and tungsten trioxide ($WO_3$), which are not limited herein.

Then the hole transport layer is ink-jet printed on a surface of the hole injection layer. Similarly, ink of the hole transport layer may only be located on the surface of the previously formed hole injection layer and cannot cross the second barrier wall. The hole transport layer may be made of tertiary aromatic amine N,N'-diphenyl-N,N'-bis(3-methylphenyl)-1,1'-biphenyl-4,4'-diamine (TPD), N,N'-diphenyl-N,N'-(1-naphthyl)-1,1'-biphenyl-4,4'-diamine (NPB), 4,4'-bis(9-carbazole)biphenyl (CBP), or isoindole materials, which are not limited herein.

Then the light emitting layers are sequentially ink-jet printed on the surfaces of the hole transport layers. Light emitting layer ink for emitting red light is ink-jet printed on a red light emitting device column; light emitting layer ink for emitting green light is ink-jet printed on a green light emitting device column; and light emitting layer ink for emitting blue light is ink-jet printed on a blue light emitting device column. The ink in the light emitting layer cannot cross the second barrier wall, such that color crosstalk may be avoided.

Then the whole electron transport layer is evaporated on each of the light emitting layers and the second barrier walls. The electron transport layer may be made of 8-hydroxyquinoline aluminum ($Alq_3$), 2-(4-biphenyl)-5-(4-tertiary-butylphenyl)-1,3,4-oxadiazole (PBD), 1,3,5-tris(1-phenyl-1H-benzimidazole-2-yl)benzene (TPBi), or other materials, which are not limited herein.

Then the whole electron injection layer is evaporated on a surface of the electron transport layer. The electron injection layer may be made of lithium fluoride (LiF), sodium fluoride (NaF), cesium fluoride (CsF), calcium (Ca), barium (Ba), or other materials, which are not limited herein.

Then the whole cathode layer is evaporated on a surface of the electron injection layer. The cathode layer may be made of silver (Ag) or other materials, which are not limited herein.

Finally, the encapsulation layer is evaporated on the cathode layer, and the encapsulation layer is configured to encapsulate and protect the light emitting devices.

Thicknesses of film layers such as the hole injection layer, the hole transport layer, the light emitting layer, the electron transport layer and the electron injection layer are sized in nanometer, and an optical path of light incident on the films is ignorable. Therefore, total reflection of the medium units in the medium layer may be considered to occur between interfaces of the encapsulation layer and the medium units, a refractive index of the medium layer needs to be smaller than a refractive index of the encapsulation layer, and further a condition that a light ray may enter an optically thinner medium from an optically denser medium is satisfied. In practical application, the refractive index of the encapsulation layer is about 1.8, such that the refractive index of the medium layer 4 needs to be smaller than 1.8.

In some embodiments, after the pixel defining layer is manufactured, the hole injection layer, the hole transport layer, the light emitting layer, the electron transport layer, the electron injection layer and the cathode layer may be manufactured, and then the medium layer may be formed on a surface of the cathode layer facing away from the pixel defining layer. Reference may be made to the above embodiments for processes and materials for manufacturing functional layers and light emitting layers of the light emitting devices, which will not be repeated herein.

The medium layer may be made of acrylic materials, and patterns of medium units in the medium layer may be formed through any one of a photoresist hot melting method, a chemical vapor deposition method, or an inkjet printing method.

The medium layer is arranged on the cathode layer, such that the functional layer of the light emitting device may be prevented from being cut by the medium layer when being manufactured, the encapsulation layer may further make direct contact with the medium layer, and total reflection occurs at the interface between the encapsulation layer and the medium layer.

Although preferred embodiments of the present disclosure have been described, those skilled in the art can still make additional changes and modifications to the embodiments once they learn the basic inventive concept. Therefore, the appended claims are intended to be interpreted as including the preferred embodiments and all changes and modifications falling within the scope of the present disclosure.

Apparently, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A display panel, comprising:
a base substrate;
a driver circuit layer on the base substrate;
a planarization layer at one side of the driver circuit layer facing away from the base substrate, wherein the planarization layer comprises a plurality of via holes;
a pixel defining layer on the planarization layer, wherein the pixel defining layer comprises: a plurality of first barrier walls and a plurality of second barrier walls, the plurality of first barrier walls extend in a first direction and are arranged in a second direction, and the plurality of second barrier walls extend in the second direction and are arranged in the first direction; the first direction intersects with the second direction; and the plurality of first barrier walls and the plurality of second barrier walls form a plurality of openings; wherein each of the plurality of openings is enclosed by two adjacent first barrier walls of the plurality of first barrier walls in the second direction and two adjacent second barrier walls of the plurality of second barrier walls in the first direction; and a light emitting device layer at one side of the pixel defining layer facing away from the planarization layer, wherein the light emitting device layer comprises a plurality of light emitting devices, and each of the plurality of light emitting devices is correspondingly arranged in one of the plurality of openings; and the plurality of via holes and the plurality of light emitting devices are in a one-to-one correspondence, and the plurality of light emitting devices are electrically connected to the driver circuit layer through the plurality of via holes, wherein heights of the plurality of first barrier walls are smaller than heights of the plurality of second barrier walls, and orthographic projections of the plurality of via holes on the base substrate are located in orthographic projections of the plurality of second barrier walls on the base substrate;

wherein the orthographic projections of the plurality of via holes on the base substrate are located in orthographic projections of intersection areas between the plurality of first barrier walls and the plurality of second barrier walls on the base substrate; and wherein light emitting devices of the plurality of light emitting devices, which are correspondingly arranged in openings of the plurality of openings between the two adjacent second barrier walls of the plurality of second barrier walls in the first direction, have a same color.

2. The display panel according to claim 1, wherein widths of the plurality of first barrier walls in the second direction are greater than widths of the plurality of second barrier walls in the first direction.

3. The display panel according to claim 1, further comprising:

a medium layer at one side of the pixel defining layer facing away from the planarization layer; and an encapsulation layer at one sides of the pixel defining layer and the light emitting device layer facing away from the planarization layer, wherein a refractive index of the encapsulation layer is greater than a refractive index of the medium layer.

4. The display panel according to claim 3, wherein the medium layer comprises a plurality of medium units, and sizes of the orthographic projections of the plurality of via holes on the base substrate are greater than sizes of orthographic projections of the plurality of medium units on the base substrate.

5. The display panel according to claim 4, wherein the plurality of medium units are arranged along peripheral edges of the plurality of openings separately.

6. The display panel according to claim 5, wherein adjacent medium units in the plurality of medium units are separated by a set distance, and the set distance is smaller than a width of any one of the plurality of medium units.

7. The display panel according to claim 4, wherein medium units in the plurality of medium units at one side of the plurality of first barrier walls facing away from the planarization layer are first medium units, and medium units in the plurality of medium units at one side of the plurality of second barrier walls facing away from the planarization layer are second medium units; and widths of the first medium units are equal to widths of the second medium units.

8. The display panel according to claim 7, wherein a distance between two rows of the first medium units located on a same first barrier wall and arranged at edges of two adjacent openings is greater than the widths of the first medium units; and a distance between two rows of the second medium units located on a same second barrier wall and arranged at edges of two adjacent openings is smaller than the widths of the second medium units.

9. The display panel according to claim 7, wherein a distance between adjacent first medium units in the first medium units at an edge of a same opening is greater than a distance between adjacent second medium units in the second medium units.

10. The display panel according to claim 7, wherein heights of the first medium units are the same as heights of the second medium units.

11. The display panel according to claim 7, wherein heights of the first medium units are greater than heights of the second medium units; and a surface of one side of the first medium units facing away from the plurality of first barrier walls is flush with a surface of one side of the second medium units facing away from the plurality of second barrier walls.

12. The display panel according to claim 4, wherein one of the plurality of medium units is in a shape of a cylinder.

13. The display panel according to claim 4, wherein widths of the plurality of medium units decrease and then increase in a direction away from the pixel defining layer.

14. A display apparatus, comprising a display panel, wherein the display panel comprises:

a base substrate;

a driver circuit layer on the base substrate;

a planarization layer at one side of the driver circuit layer facing away from the base substrate, wherein the planarization layer comprises a plurality of via holes;

a pixel defining layer on the planarization layer, wherein the pixel defining layer comprises: a plurality of first barrier walls and a plurality of second barrier walls, the plurality of first barrier walls extend in a first direction and are arranged in a second direction, and the plurality of second barrier walls extend in the second direction and are arranged in the first direction; the first direction intersects with the second direction; and the plurality of first barrier walls and the plurality of second barrier walls form a plurality of openings; wherein each of the plurality of openings is enclosed by two adjacent first barrier walls of the plurality of first barrier walls in the second direction and two adjacent second barrier walls of the plurality of second barrier walls in the first direction; and a light emitting device layer at one side of the pixel defining layer facing away from the planarization layer, wherein the light emitting device layer comprises a plurality of light emitting devices, and each of the plurality of light emitting devices is correspondingly arranged in one of the plurality of openings; and the plurality of via holes and the plurality of light emitting devices are in a one-to-one correspondence, and the plurality of light emitting devices are electrically connected to the driver circuit layer through the plurality of via holes, wherein heights of the plurality of first barrier walls are smaller than heights of the plurality of second barrier walls, and orthographic projections of the plurality of via holes on the base substrate are located in orthographic projections of the plurality of second barrier walls on the base substrate;

wherein the orthographic projections of the plurality of via holes on the base substrate are located in orthographic projections of intersection areas between the plurality of first barrier walls and the plurality of second barrier walls on the base substrate; and wherein light emitting devices of the plurality of light emitting devices, which are correspondingly arranged in openings of the plurality of openings between the two adjacent second barrier walls of the plurality of second barrier walls in the first direction, have a same color.

15. The display apparatus according to claim 14, wherein widths of the plurality of first barrier walls in the second direction are greater than widths of the plurality of second barrier walls in the first direction.

16. The display apparatus according to claim 14, wherein the display panel further comprises:

a medium layer at one side of the pixel defining layer facing away from the planarization layer; and an encapsulation layer at one sides of the pixel defining layer and the light emitting device layer facing away from the planarization layer, wherein a refractive index of the encapsulation layer is greater than a refractive index of the medium layer.

17. The display apparatus according to claim 16, wherein the medium layer comprises a plurality of medium units, and sizes of the orthographic projections of the plurality of via holes on the base substrate are greater than sizes of orthographic projections of the plurality of medium units on the base substrate.

* * * * *